United States Patent [19]

Layton

[11] 4,198,687
[45] Apr. 15, 1980

[54] BUBBLE MEMORY PACKAGE WITH THERMAL CONTROL

[75] Inventor: Wilbur T. Layton, San Diego, Calif.

[73] Assignee: Burroughs Corporation, Detroit, Mich.

[21] Appl. No.: 933,053

[22] Filed: Aug. 11, 1978

[51] Int. Cl.² ............................................. G11C 5/04
[52] U.S. Cl. ........................................................ 365/2
[58] Field of Search ............................................ 365/2

[56] References Cited

U.S. PATENT DOCUMENTS

| 4,096,581 | 6/1978 | Carlo et al. | 365/2 |
| 4,101,970 | 7/1978 | Saito et al. | 365/2 |

Primary Examiner—James W. Moffitt
Attorney, Agent, or Firm—Joseph R. Dwyer; Kevin R. Peterson

[57] ABSTRACT

A package of bubble memory components including magnetic bubble memory chips or modules disposed between bias magnets for maintaining and establishing bubbles in said chips, field drive coils for propagating the bubbles established in the chips and thermal management means for stabilizing and dissipating the heat generated within the package including heat conductor means disposed adjacent to the drive coils for conducting heat therefrom and flexible heat conductor means also disposed adjacent the drive coils and flexed, sometimes folded back, toward other components of the package to control the heat of these other components thus stabilizing the temperature of the components with respect to the heat generated by the drive coils.

11 Claims, 6 Drawing Figures

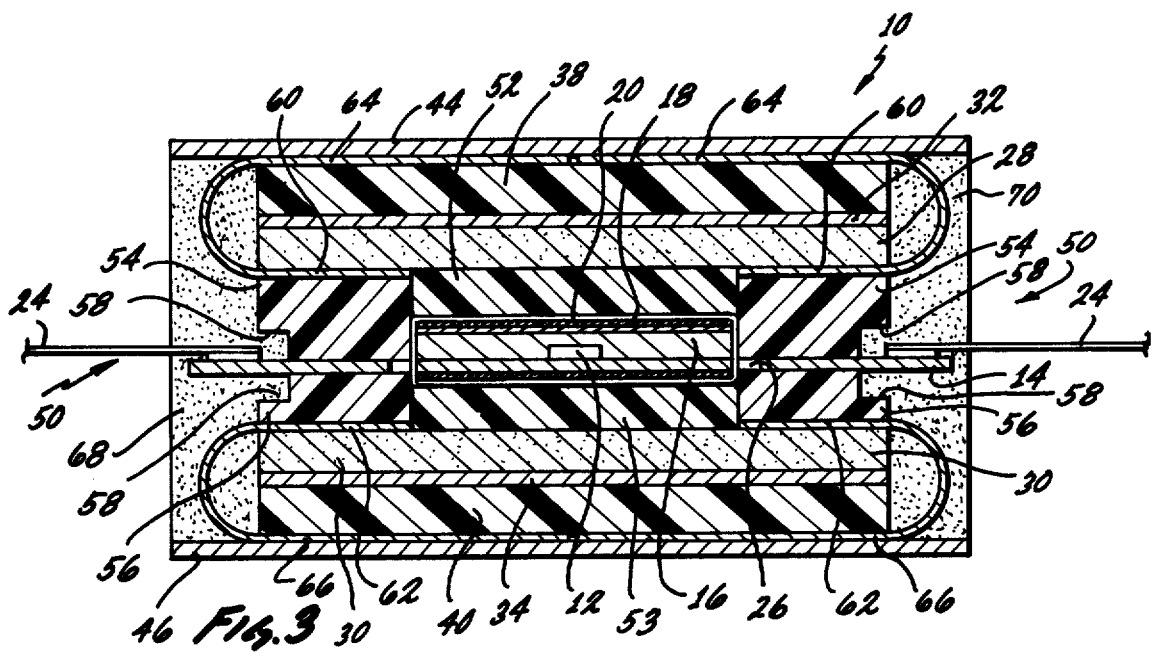
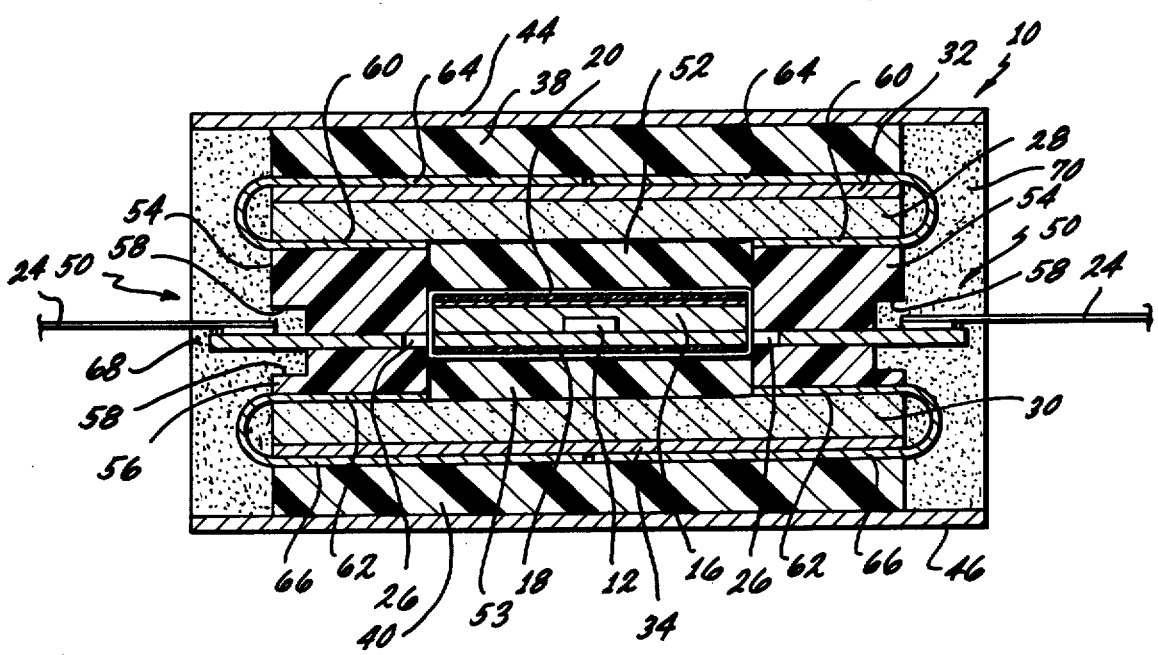

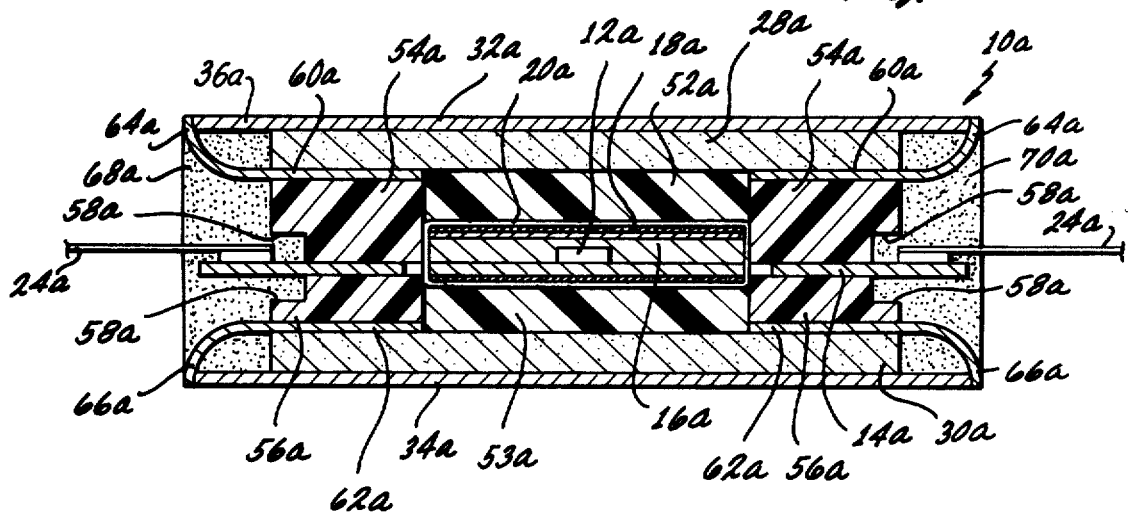
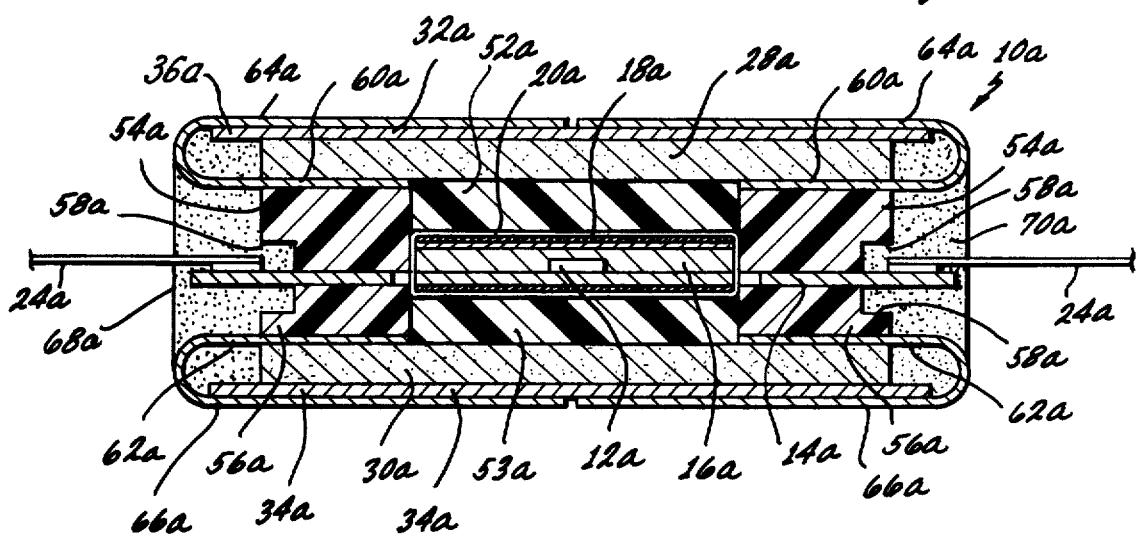

BUBBLE MEMORY PACKAGE WITH THERMAL CONTROL

CROSS-REFERENCE TO RELATED APPLICATIONS

U.S. application Ser. No. 933,055 entitled "THERMAL CONTROL MEMBER, BUBBLE MEMORY" filed Aug. 11, 1978.

BACKGROUND OF THE INVENTION

This invention relates to magnetic bubble (domain) assemblies and more particularly to a magnetic bubble package arrangement having improved heat control heat distribution and heat dissipation.

A magnetic bubble package comprises one or more chips or modules containing a thin layer of garnet-like material formed on a substrate and disposed between bias magnets to provide a bias field normal to the plane of the substrate to establish and maintain bubbles in the garnet-like material. For bubble movement (propagation) in the plane of the garnet-like material, field drive coils provide rotational in-plane magnetic fields and surround the substrate. Means are also provided to interconnect the chips to one another, if there is more than one chip in the package, to the control circuitry for performing various bubble manipulations in the chips and to connect the memory to the outside world. It is, of course, desirable to maintain the space of these assembled components, ie., coils, chips, interconnect circuitry, etc. as small as possible for a number of reasons including reducing the power requirements of the field drive coils. However, it is also recognized that the largest source of heat comes from the field drive coils during operation and that, unless this heat is dissipated or controlled, the operating characteristics of the bias magnets and the chips are materially and sometimes adversely affected. It is especially desirable to maintain the temperature of the bias magnets as close to the temperatures of the chips as possible so that the bias fields will remain constant relative to the chips thus not disrupting the size or disposition of the bubbles.

Accordingly, it is a primary object of this invention to provide a magnetic bubble memory package with means for controlling, distributing and dissipating the heat of a bubble memory package.

A second object of this invention is to provide a magnetic bubble memory package with means for distributing the heat generated in the package to various parts or areas within the package to thus control magnetic properties of the package components.

Still another object of this invention is to provide a magnetic bubble memory package with means of distributing the heat generated in the package to various areas of the package so that all parts are at a stabilized temperature during operation.

SUMMARY OF THE INVENTION

The package having bubble memory components which accomplishes the foregoing objects comprises heat conductor means disposed in general with the drive coils to cause the heat generated by the drive coils to be dissipated in the ambient air. In one embodiment flexible heat conductors are attached to the heat conductor means to conduct heat away from the drive coils and radiate the heat into the ambient air. In other embodiments of the invention, the flexible heat conductor means can be placed either against one wall of a housing to conduct the heat generated by the drive coils to the housing or the flexible conductor means can be located adjacent in various components of the package such as adjacent the bias magnets to heat the bias magnets until the package is in a stabilized temperature condition.

BRIEF DESCRIPTION OF THE DRAWINGS

FIG. 3 is a cross-sectional view similar to FIG. 2 but showing the flexible heat conductor means in another arrangement;

FIG. 4 is a cross-sectional view similar to FIGS. 2 and 3 but showing the flexible heat conductor means in still another arrangement;

FIG. 5 is a cross-sectional view of another embodiment of the bubble memory package where the magnetic yoke is used as the outer housing and the flexible heat conductor means in one arrangement similar to that of FIG. 2.

FIG. 6 is a cross-sectional view similar to FIG. 5 but showing this flexible heat conductor means in another arrangement similar to that of FIG. 4.

BRIEF DESCRIPTION OF THE PREFERRED EMBODIMENT

Figure 1:
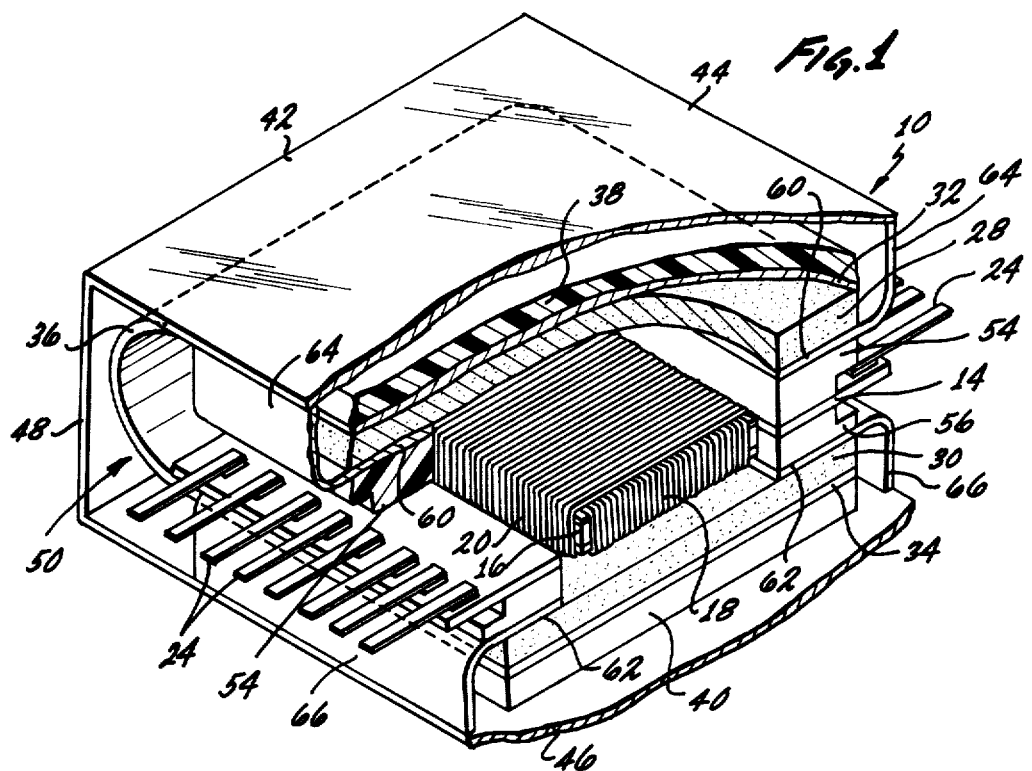
FIG. 1 is a perspective view of one embodiment of the bubble memory package with a portion broken away to clearly disclose the various components of the package and their relationship to one another.
Figure 2:
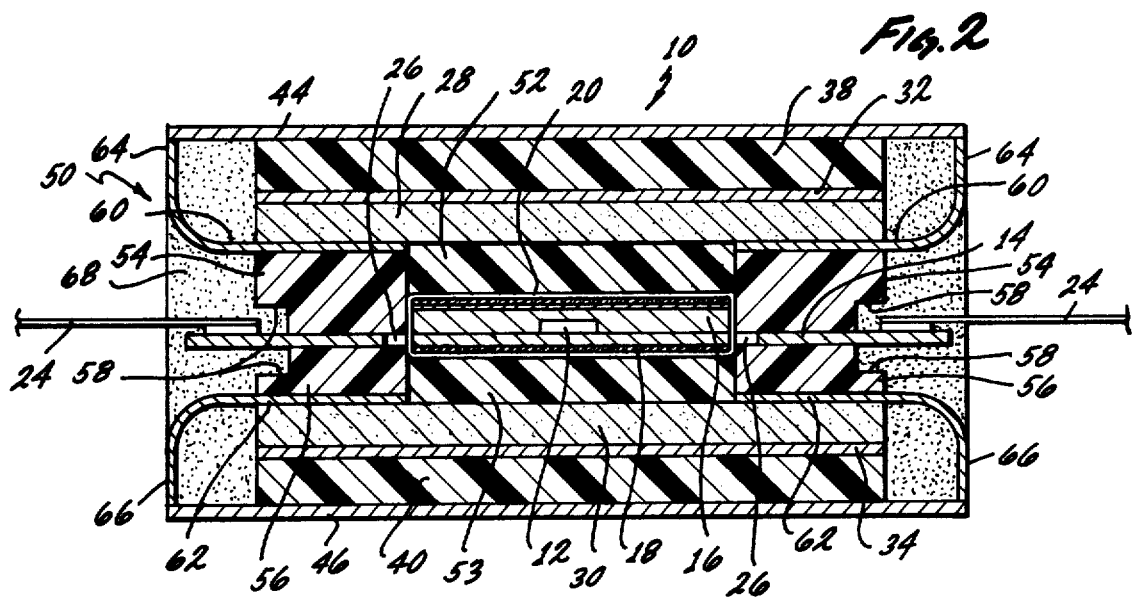
FIG. 2 is an elevational cross-sectional view of the package shown in FIG. 1 and showing one arrangement of the flexible heat conductor means.

FIG. 1 discloses, as a first embodiment of the invention, a package 10 of bubble memory components which includes an innerassembly of one or more magnetic bubble chips 12 disposed, by way of example, on a single substrate 14 and enclosed in a cabinet 16. The cabinet supports and spaces a pair of encompassing orthogonally oriented magnetic field generating drive coils 18 and 20 for propagating the bubbles within the chip. The substrate 14 contains conductors for interchip communication and terminals for external connection to the outside world via conductors 24 and is suitably slotted at 26 to permit the coils to be wound around the cabinet.

A pair of relatively flat bias magnets 28 and 30 are fixed to legs 32 and 34 of the U-shaped and closed yoke. The yoke is conventionally made of a relatively thin magnetically soft material to complete the magnetic circuit for the bias magnets. These magnets are disposed on both sides of the innerassembly and as close as possible thereto for providing a suitable bias, normal to the plane of the substrate, for forming and maintaining the bubbles on the magnetic material within the chips 12. Located on the outside of the yoke 36, that is, on the side of the yoke legs opposite the bias magnets 28 and 30, are a pair of compliant thermal control units 38 and 40. These units are relatively flat discrete, parallelipipeds formed of a resilient material containing suitable material so as to be thermally conductive for dissipating/controlling the heat generated by the drive coils 18 and 20 during operation of the chips. The amount of heat dissipated by the compliant units depends upon the composition of the material selected. Reference is made to the copending application Ser. No. 933,055, supra, for more detailed information on these units and to the Table A reproduced hereinafter from said copending application; suffice to say herein that they are compliant heat control units for controlling the heat generated in the package. These complaint units also perform another function in the package by compensating for any misaligned or tolerance variations in or among the components by the resiliency of these units.

The entire assembly, comprising the first embodiment and thus far described, is then contained in a metallic housing or container 42 comprising a top 44 and bottom 46 and two side walls 48 (only one shown in FIG. 1). The housing is open at each end 50 and the material of the housing is selected for its thermal conductive, radiation and magnetic shielding qualities, as for example, a soft magnetic material such as a selected nickel-iron alloy. It is to be noted that the compliant units 38 and 40 in FIGS. 2, 4, 5 and 6 engage the top and bottom walls 44 and 46 for direct heat transfer thereto.

As aforesaid, a major source of heat during the operation of the bubble memory package is the heat generated by the drive coils in propagating the magnet bubbles within the chips 12. Heretofore, this heat has adversely influenced the bias magnets and the bubbles and, in general, has caused a malfunction of the chip. As explained, heretofore, this invention is directed to the solution of this problem.

First, the innerassembly or cabinet 16 with coils 18 and 20 is positioned between the bias magnets by spacer elements 52 and 53 which space the innerassembly relative to the bias magnets. Secondly, heat control units 54 and 56, shown in the illustrated embodiment as relatively thin or flat discrete parallelpiped members, are located on the top and lower surface of the substrate 14, and engage the sides of the drive coils to conduct heat from these drive coils toward the openings 50 of the housing. These control units are provided with preformed channels 58 which together form an opening to allow access to the substrate for connecting the conductors 24.

It should be pointed out at this time that the spacer elements 52,53 and the heat control units 54,56 having a heat management function are made of a material selected from the table of materials listed in the copending application Ser. No. 933,055, supra, and may be of the same material as the thermal compliant units 38 and 40 depending on the needs of the package.

In addition, to complete the thermal control of the package, a pair of thin flexible heat conductor members 60 and 62 formed of a material, such as copper on Kapton, have one end selectively located in the area where heat is fleasibly conducted thereto, such as connected thermally, in any suitable manner, to the heat control units 54 and 56 while the other ends 64 and 66 are located where the control of the heat may be of benefit to the operation of the package.

There are a number of plates where this benefit may be accomplished depending upon the desired results. For example, as in FIG. 2, the ends 64 and 66 of the flexible conductors are located facing the open ends 50 of the housing, that is the flexible conductive extend upwardly and downwardly, respectively, they fan out from the heat control units 54 and 56 towards the top and bottom walls of the housing. In this position, the ends 64 and 66 act as radiators dissipating the heat into the ambient air. It is to be understood, of course, that in the manufacture the package and in the positioning of the flexible conductor, the space in and around heat control units 54 and 56 and the flexible conductors 60 and 62 is filled with a material such as Scotchcast 550 or Emmerson and Cummings Stycase 3020 and fix these pieces and all of the components in place.

As another example of the use of the flexible heat conductors, if it is desired to make use of the generated heat, for example, to bring the bias magnets as close as possible to the temperature of the propagate coils, then the ends 64 and 66 are flexed and brought into alignment with and disposed between the thermal control units 38 and 40 and the top and bottom walls respectively of the housing. This is shown in FIG. 3. Thus, the generated heat is conducted directly to the housing where it is dissipated in the ambient air, yet on the other hand, some of the heat would be contained in the thermal control units 38 and 40. FIG. 4 shows, on the other hand, where the generated heat can be managed in a different manner, that is, by locating the ends 64 and 66 of the flexible conductors between the thermal control units 38 and 40 and the legs 32 and 34 of the yoke 36. The conducted heat will, in this arrangement, have a more direct affect on the bias magnets.

Turning now to FIGS. 5 and 6 there is shown a package 10a in which the components having the same function described in connection with FIGS. 1 through 4 are given the same reference numerals except for the suffix "a" so that the operation of the package will be understood without further detailed description. In this embodiment, however, it is important to note that the housing 42 and the thermal compliant members 38 and 40 have been omitted and the yoke 36a itself with legs 32a and 34a comes the outer housing. In this embodiment the flexible conductor units 60a and 62a with their respective ends 64a and 66a are brought out as radiation means into engagement, or nearly so, with the legs 32a, and 34a of the yoke so as to function as described above in connection with FIG. 2 or further flexed and brought to engage the top of the yoke as shown in FIG. 6 to perform the function of heating the bias magnets by being in contact with the yoke itself as well as radiating heat. The purpose of this latter arrangement of FIGS. 5 and 6 are for those requirements in systems where space will not permit an outer housing. Otherwise, the function of the thermal control units in the package is the same and the components are similarly held in place by epoxy.

Thus, according to the foregoing, it can be seen that there is disclosed a thermal management means for a bubble memory package in its broadest sense where the heat generated by and in the package can be controlled and utilized for the benefit of the operation of the package.

TABLE A

| NAME (Density) | % LOAD (By wt.) | HARDNESS (Shore A) | THERMAL CONDUCTIVITY (W/in. °C × 10$^{-3}$) |
|---|---|---|---|
| Aluminum Oxide | — | — | 17.20 |
| Al$_2$O$_3$+R6103 | 40 | 64 | 1.70 |
| Al$_2$O$_3$+R6103 | 60 | 69 | 1.92 |
| Al$_2$O$_3$+R6103 | 80 | 71 | 2.44 |
| Al$_2$O$_3$+R6103 | 100 | 78 | 3.07 |
| Al$_2$O$_3$+R6103 | 150 | 84.5 | 4.08 |
| Zinc Oxide | — | — | 15.10 |
| ZnO+R6103 | 25 | 65 | 1.40 |
| ZnO+R6103 | 50 | 65 | 2.78 |
| ZnO+R6103 | 75 | 72 | 3.40 |
| ZnO+R6103 | 100 | 75 | 3.85 |
| Lead Oxide | — | — | |
| Pb$_3$O$_4$+R6103 | 25 | 58 | 5.48 |
| Pb$_3$O$_4$+R6103 | 50 | 55 | 7.54 |
| Pb$_3$O$_4$+R6103 | 75 | 51 | 10.51 |

TABLE A-continued

| NAME (Density) | % LOAD (By wt.) | HARDNESS (Shore A) | THERMAL CONDUCTIVITY (W/in. °C × 10⁻³) |
|---|---|---|---|
| Pb₃O₄+R6103 | 100 | 48 | 12.51 |
| Ferric Oxide | — | — | 14.99 |
| Fe₂O₃+R6103 | 25 | 63 | 1.55 |
| Fe₂O₃+R6103 | 50 | 66 | 1.67 |
| Fe₂O₃+R6103 | 75 | 69 | 1.89 |
| Boron Nitride | — | — | |
| BN+R6103 | 10 | 62 | 1.78 |
| BN+R6103 | 25 | 66 | 2.37 |
| BN+R6103 | 40 | 72 | 2.81 |
| BN+R6103 | 50 | 75 | 3.00 |

What is claimed is:

1. A magnetic bubble package having an assembly of bubble memory components comprising,
   bubble memory chip means mounted on a substrate,
   said substrate containing electrical conductors,
   a plurality of drive coils for providing a magnetic field rotating in the plane of said chip means,
   a yoke means with bias magnets on each leg thereof and located with respect to said device coils and said chip means to provide a magnetic field normal to the plane of said chip means,
   first heat control means made of material selected for their thermal conductive qualities and positioned on said substrate and in engagement with means surrounding said bubble memory chip and said bias magnet and serving to space said bubble memory chip from said bias magnets,
   said first heat control means also engaging a portion of said drive coils for transferring heat generated by said drive coils away from said coils, and
   second heat control means comprising relatively thin flat, flexible heat conductor means separate from said conductors on said substrate and engaging said first heat control means and other components of said assembly for conducting heat away from said coils and said first heat control means.

2. The magnetic bubble package as claimed in claim 1 wherein said flexible heat conductor means extend to the sides of said assembly and are exposed to the ambient air to radiate said heat generally by said drive coils into the ambient air.

3. The magnetic bubble package as claimed in claim 1 wherein said flexible heat conductor means are looped and folded back so as to be aligned with said yoke and said bias magnets to conduct heat from said drive coils to an area adjacent to said bias magnets.

4. A magnetic bubble package as claimed in claim 1 further including a housing made of a material selected for its thermal conductive, radiation and magnetic shielding qualities and enclosing said assembly.

5. The magnetic bubble package as claimed in claim 4 further including third heat control means comprising discrete members made of materials selected for their thermal conductive and resilient qualities and located on each leg of said yoke opposite to said bias magnets and wherein a portion of said flexible conductors engage said third heat control means to conduct heat from said drive coils to said third heat control means.

6. The magnetic bubble package as claimed in claim 4 wherein a portion of said flexible heat conductor means are located between said third heat control means and the legs of said yoke.

7. The magnetic bubble package as claimed in claim 4 wherein a portion of said flexible heat conductor means are located between said third heat control means and said housing.

8. The magnetic bubble package as claimed in claim 4 wherein a portion of said flexible heat conductor means are looped and folded back so that portions thereof are between said housing and said third heat control means for conducting heat from said drive coils to said housing and third heat control means.

9. The magnetic bubble package as claimed in claim 4 wherein said flexible heat conductor means are looped and folded back so that portions thereof are located between said legs and said third heat control means for conducting heat from said drive coils to said yoke and said third heat control means.

10. The magnetic bubble package as claimed in claim 9 wherein said third heat control means being resilient compensate for any misalignment among the components of said assembly.

11. A bubble memory package comprising:
    at least one level of bubble memory devices;
    bias magnets means for establishing and maintaining said bubble memory device,
    first and second drive coils adapted to generate first and second magnetic fields respectively, each coil oriented so that the magnetic field generated thereby is operative to propagate bubbles in said memory devices,
    a housing member for said assembly,
    heat control means disposed in engagement with one of said drive coils to conduct heat from said drive coils to said housing, said heat control means also serving to space said bubble memory device from said bias magnets,
    and relatively thin flexible heat conductor members disposed between said heat control means and folded so to extend beyond the level of said level of bubble memory devices but spaced therefrom for thermally conducting heat generated by said drive coils to other components of said assembly to control the temperature of the package and other components of said assembly.

* * * * *